(12) United States Patent
Nakamura et al.

(10) Patent No.: US 11,314,913 B2
(45) Date of Patent: Apr. 26, 2022

(54) INFORMATION PROCESSING APPARATUS, PROGRAM, AND SIMULATION METHOD

(71) Applicant: Kabushiki Kaisha Zuken, Kanagawa (JP)

(72) Inventors: Satoshi Nakamura, Kanagawa (JP); Masato Andou, Kanagawa (JP); Masafumi Myouse, Kanagawa (JP)

(73) Assignee: Kabushiki Kaisha Zuken, Kanagawa (JP)

( * ) Notice: Subject to any disclaimer, the term of this patent is extended or adjusted under 35 U.S.C. 154(b) by 0 days.

(21) Appl. No.: 17/482,924

(22) Filed: Sep. 23, 2021

(65) Prior Publication Data
US 2022/0012398 A1 Jan. 13, 2022

Related U.S. Application Data

(63) Continuation of application No. PCT/JP2019/013642, filed on Mar. 28, 2019.

(51) Int. Cl.
*G06F 30/367* (2020.01)

(52) U.S. Cl.
CPC .................... *G06F 30/367* (2020.01)

(58) Field of Classification Search
USPC ........................................... 716/106
See application file for complete search history.

(56) References Cited

U.S. PATENT DOCUMENTS

| 4,321,706 A * | 3/1982 | Craft .................... H03C 3/0941 |
| | | 375/295 |
| 5,255,229 A * | 10/1993 | Tanaka .................... G11C 29/50 |
| | | 365/201 |
| 6,348,835 B1 * | 2/2002 | Sato ........................ G05F 3/262 |
| | | 327/543 |
| 10,491,167 B1 * | 11/2019 | Far .......................... H03G 3/30 |
| 2002/0145476 A1 * | 10/2002 | Yoon Lee ............ H03K 5/1252 |
| | | 331/57 |
| 2010/0204975 A1 | 8/2010 | Nakayama et al. |

(Continued)

FOREIGN PATENT DOCUMENTS

| JP | 0481978 A | 3/1992 |
| JP | 05135131 A | 6/1993 |

(Continued)

OTHER PUBLICATIONS

IPRP Issued in corresponding parent International Application No. PCT/JP2019/013642 dated May 27, 2021.

(Continued)

*Primary Examiner* — Mohammed Alam
(74) *Attorney, Agent, or Firm* — Venable LLP

(57) ABSTRACT

An information processing apparatus includes a conversion unit configured to convert circuit configuration data representing a configuration of an electric circuit including an input terminal group and an output terminal group into circuit calculation data including an equation group that generates an output signal group corresponding to an argument group given to a variable group and an input signal group given to the input terminal group, wherein the argument group includes a constant representing a characteristic of a circuit element that forms the electric circuit.

22 Claims, 14 Drawing Sheets

(56) References Cited

U.S. PATENT DOCUMENTS

| | | | | |
|---|---|---|---|---|
| 2010/0295626 A1* | 11/2010 | Kim | ............... | H03B 5/1243 |
| | | | | 331/117 FE |
| 2011/0029298 A1 | 2/2011 | Clement et al. | | |
| 2021/0335317 A1* | 10/2021 | Liu | ............... | G09G 3/3674 |
| 2022/0012398 A1* | 1/2022 | Nakamura | ............ | G06F 30/367 |

FOREIGN PATENT DOCUMENTS

| | | | |
|---|---|---|---|
| JP | 0619997 A | 1/1994 | |
| JP | 0676014 A | 3/1994 | |
| JP | 2006014393 A | 1/2006 | |
| JP | 2009541891 A | 11/2009 | |
| JP | 2012089107 A | 5/2012 | |
| WO | 2009050768 A1 | 4/2009 | |

OTHER PUBLICATIONS

Written Opinion and International Search Report issued in corresponding parent International Application No. PCT/JP2019/013642 dated Jun. 25, 2019.

Extended European Search Report issued on Feb. 15, 2022 in counterpart European Patent Appln. No. 19921709.2.

El Mouatez Billah Messini, "RLC circuit in simulink," Jun. 18, 2016 (Jun. 18, 2016), XP055887672, URL: https://www.youtube.com/watch?v=_gn-vi CJu9g.

Lineartechnology:,"LTspice IV: Noise Simulations," May 8, 2013 (May 8, 2013), XP055887715, URL: https://www.youtube.com/watch?v=hBsBI2 7etYs.

Suzuki, Ryohei et al., "A Fpga implementation of DFIG Wind Turbines for Analog-Digital Hybrid Real-Time Simulation," Proceedings of the 44TH Annual Conference of the IEEE Industrial Electronics Society, Oct. 21, 2018 (Oct. 21, 2018), pp. 39-44, XP033486411.

Sriyananda H, "A systems approach to circuits, measurements and control," Lecture Notes University of Moratuwa, Dec. 31, 2004 (Dec. 31, 2004), pp. 164-213, XP055887659, URL: https://uom.lk/sites/default/files/elect/files/ee321s3.3.pdf.

Anonymous, "Temperature coefficient—Wikipedia," Feb. 1, 2019 (Feb. 1, 2019), pp. 1-4, XP055887669, URL: https://en.wikipedia.org/w/index.php7title=Temperature_coefficient&oldid=881208649.

* cited by examiner $$\begin{pmatrix} G_{11} & \cdots & G_{1n} \\ \vdots & \ddots & \vdots \\ G_{n1} & \cdots & G_{nn} \end{pmatrix} \begin{pmatrix} x_1 \\ \vdots \\ x_n \end{pmatrix} = \begin{pmatrix} A_1 \\ \vdots \\ A_n \end{pmatrix}$$

FIG. 11

$$\begin{pmatrix} G & -G & 0 & 0 & 1 & 0 \\ -G & G+G_L & -G_L & 0 & 0 & 0 \\ 0 & -G_L & G_L & 0 & 0 & 1 \\ 0 & 0 & 0 & G_c & 0 & -1 \\ 1 & 0 & 0 & 0 & 0 & 0 \\ 0 & 0 & 1 & -1 & 0 & 0 \end{pmatrix} \begin{pmatrix} v_{N1} \\ v_{N2} \\ v_{N3} \\ v_{N4} \\ i_{Vin} \\ i_{VL} \end{pmatrix} = \begin{pmatrix} 0 \\ 0 \\ 0 \\ I_c \\ V_{in} \\ V_L \end{pmatrix}$$

FIG. 12

$$\begin{pmatrix} G & -G & 0 & 0 & 1 & 0 \\ -G & G+G_L & -G_L & 0 & 0 & 0 \\ 0 & -G_L & G_L & 0 & 0 & 1 \\ 0 & 0 & 0 & G_C & 0 & -1 \\ 1 & 0 & 0 & 0 & 0 & 0 \\ 0 & 0 & 1 & -1 & 0 & 0 \end{pmatrix} \begin{pmatrix} v_{N1} \\ v_{N2} \\ v_{N3} \\ v_{N4} \\ i_{Vin} \\ i_{VL} \end{pmatrix} = \begin{pmatrix} 0 \\ 0 \\ 0 \\ I_c \\ V_{in} \\ V_L \end{pmatrix}$$

⇩

$$\left(\begin{array}{cccccc|c} G & -G & 0 & 0 & 1 & 0 & 0 \\ -G & G+G_L & -G_L & 0 & 0 & 0 & 0 \\ 0 & -G_L & G_L & 0 & 0 & 1 & 0 \\ 0 & 0 & 0 & G_C & 0 & -1 & I_c \\ 1 & 0 & 0 & 0 & 0 & 0 & V_{in} \\ 0 & 0 & 1 & -1 & 0 & 0 & V_L \end{array}\right)$$

⇩

$$\left(\begin{array}{cccccc|c} 1 & 0 & 0 & 0 & 0 & 0 & F_{v_{N1}}(G, G_C, G_L, I_c, V_{in}, V_L) \\ 0 & 1 & 0 & 0 & 0 & 0 & F_{v_{N2}}(G, G_C, G_L, I_c, V_{in}, V_L) \\ 0 & 0 & 1 & 0 & 0 & 0 & F_{v_{N3}}(G, G_C, G_L, I_c, V_{in}, V_L) \\ 0 & 0 & 0 & 1 & 0 & 0 & F_{v_{N4}}(G, G_C, G_L, I_c, V_{in}, V_L) \\ 0 & 0 & 0 & 0 & 1 & 0 & F_{i_{Vin}}(G, G_C, G_L, I_c, V_{in}, V_L) \\ 0 & 0 & 0 & 0 & 0 & 1 & F_{i_{VL}}(G, G_C, G_L, I_c, V_{in}, V_L) \end{array}\right)$$

$$v_{N2} = \left(\frac{RR_C}{R+R_L+R_C}\right)I_C + \left(\frac{R_L+R_C}{R+R_L+R_C}\right)V_{in} + \left(\frac{R}{R+R_L+R_C}\right)V_L$$

$$v_{N3} = \left(\frac{RR_C+R_LR_C}{R+R_L+R_C}\right)I_C + \left(\frac{R_C}{R+R_L+R_C}\right)V_{in} + \left(\frac{R+R_L}{R+R_L+R_C}\right)V_L$$

$$v_{N4} = \left(\frac{RR_C+R_LR_C}{R+R_L+R_C}\right)I_C + \left(\frac{R_C}{R+R_L+R_C}\right)V_{in} + \left(\frac{-R_C}{R+R_L+R_C}\right)V_L$$

$$i_{V_{in}} = \left(\frac{R_C}{R+R_L+R_C}\right)I_C + \left(\frac{-1}{R+R_L+R_C}\right)V_{in} + \left(\frac{1}{R+R_L+R_C}\right)V_L$$

$$i_{V_L} = \left(\frac{-R_C}{R+R_L+R_C}\right)I_C + \left(\frac{1}{R+R_L+R_C}\right)V\_{in} + \left(\frac{-1}{R+R_L+R_C}\right)V_L$$

FIG. 14

$$v_{N4} = \left(\frac{RR_C + R_L R_C}{R + R_L + R_C}\right)I_C + \left(\frac{R_C}{R + R_L + R_C}\right)V_{in} + \left(\frac{-R_C}{R + R_L + R_C}\right)V_L$$

$$i_{VL} = \left(\frac{-R_C}{R + R_L + R_C}\right)I_C + \left(\frac{1}{R + R_L + R_C}\right)V_{in} + \left(\frac{-1}{R + R_L + R_C}\right)V_L$$

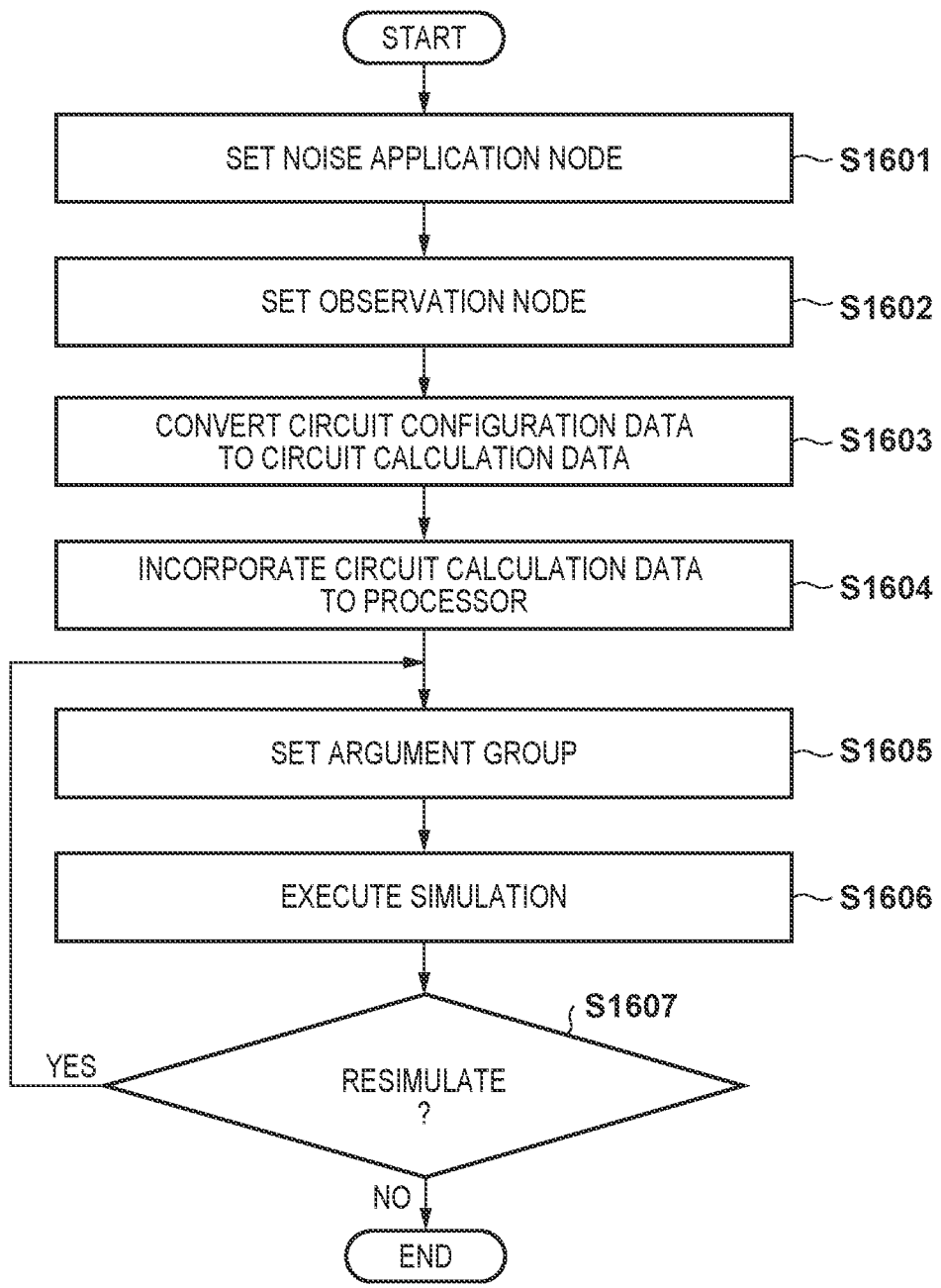

INFORMATION PROCESSING APPARATUS, PROGRAM, AND SIMULATION METHOD

CROSS-REFERENCE TO RELATED APPLICATIONS

This application is a Continuation of International Patent Application No. PCT/JP2019/013642, filed Mar. 28, 2019, which is hereby incorporated by reference herein in its entirety.

BACKGROUND OF THE INVENTION

Field of the Invention

The present invention relates to an information processing apparatus, a program, and a simulation method.

Background Art

There is known an HILS (Hardware In the Loop Simulation) using a processor including an FPGA (Field Programmable Gate Array) or a real time OS. In the HILS, some operations of a simulation target can be calculated using the processor including the FPGA or the real time OS.

In a method of simulating the operation of an electric circuit by an FPGA, for example, after the operation of the electric circuit in a case in which the constant of a certain circuit element is a first value is simulated, the operation of the electric circuit in a case in which the constant is a second value different from the first value should be simulated in some cases. In this case, it is necessary to program the FPGA to simulate the operation of the electric circuit in the case in which the constant is the first value and execute the simulation, and after that, reprogram the FPGA to simulate the operation of the electric circuit in the case in which the constant is the second value. In this case, however, it is necessary to generate data to be incorporated in the FPGA every time the constant is changed and incorporate it in the FPGA, and this leads to a delay of verification works for verification targets including the electric circuit. Such a problem also occurs when executing a simulation using the processor including the real time OS.

SUMMARY OF THE INVENTION

The present invention has been made in consideration of the above-described problem, and has as its object to provide a technique advantageous in improving the efficiency of a verification work.

According to the first aspect of the present invention, there is provided an information processing apparatus comprising a conversion unit configured to convert circuit configuration data representing a configuration of an electric circuit including an input terminal group and an output terminal group into circuit calculation data including an equation group that generates an output signal group corresponding to an argument group given to a variable group and an input signal group given to the input terminal group, wherein the argument group includes a constant representing a characteristic of a circuit element that forms the electric circuit.

According to the second aspect of the present invention, there is provided an information processing apparatus comprising a simulation execution unit configured to give an argument group to a processor incorporating circuit calculation data that is converted from circuit configuration data representing a configuration of an electric circuit including an input terminal group and an output terminal group and includes an equation group that generates an output signal group corresponding to the argument group given to a variable group and an input signal group given to the input terminal group, and operate the processor, wherein the argument group includes a constant representing a characteristic of a circuit element that forms the electric circuit.

According to the third aspect of the present invention, there is provided a program configured to cause a computer to operate as an information processing apparatus comprising a conversion unit configured to convert circuit configuration data representing a configuration of an electric circuit including an input terminal group and an output terminal group into circuit calculation data including an equation group that generates an output signal group corresponding to an argument group given to a variable group and an input signal group given to the input terminal group, wherein the argument group includes a constant representing a characteristic of a circuit element that forms the electric circuit.

According to the fourth aspect of the present invention, there is provided a program configured to cause a computer to operate as an information processing apparatus comprising a simulation execution unit configured to give an argument group to a processor incorporating circuit calculation data that is converted from circuit configuration data representing a configuration of an electric circuit including an input terminal group and an output terminal group and includes an equation group that generates an output signal group corresponding to the argument group given to a variable group and an input signal group given to the input terminal group, and operate the processor, wherein the argument group includes a constant representing a characteristic of a circuit element that forms the electric circuit.

According to the fifth aspect of the present invention, there is provided a simulation method comprising a conversion step of converting circuit configuration data representing a configuration of an electric circuit including an input terminal group and an output terminal group into circuit calculation data including an equation group that generates an output signal group corresponding to an argument group given to a variable group and an input signal group given to the input terminal group, an incorporating step of incorporating the circuit calculation data in a processor, and a simulation execution step of giving the argument group to a processor incorporating the circuit calculation data and operate the processor, wherein the argument group includes a constant representing a characteristic of a circuit element that forms the electric circuit.

According to the present invention, it is possible to provide a technique advantageous in improving the efficiency of a verification work.

BRIEF DESCRIPTION OF THE DRAWINGS

FIG. 7A is a view showing an example in which a resistor is converted into a circuit element model corresponding to that;

FIG. 7B is a view showing an example in which a capacitor is converted into a circuit element model corresponding to that;

FIG. 7C is a view showing an example in which an inductor is converted into a circuit element model corresponding to that;

FIG. 11 is a view showing an equation of a matrix representation;

FIG. 12 is a view showing a manipulation of the equation of the matrix representation;

FIG. 13 is a view showing the result of the matrix manipulation;

FIG. 14 is a view showing extracted equations; and

FIG. 15 is a flowchart showing a simulation method in the simulation system according to the embodiment of the present invention.

DESCRIPTION OF THE EMBODIMENTS

Figure 1:
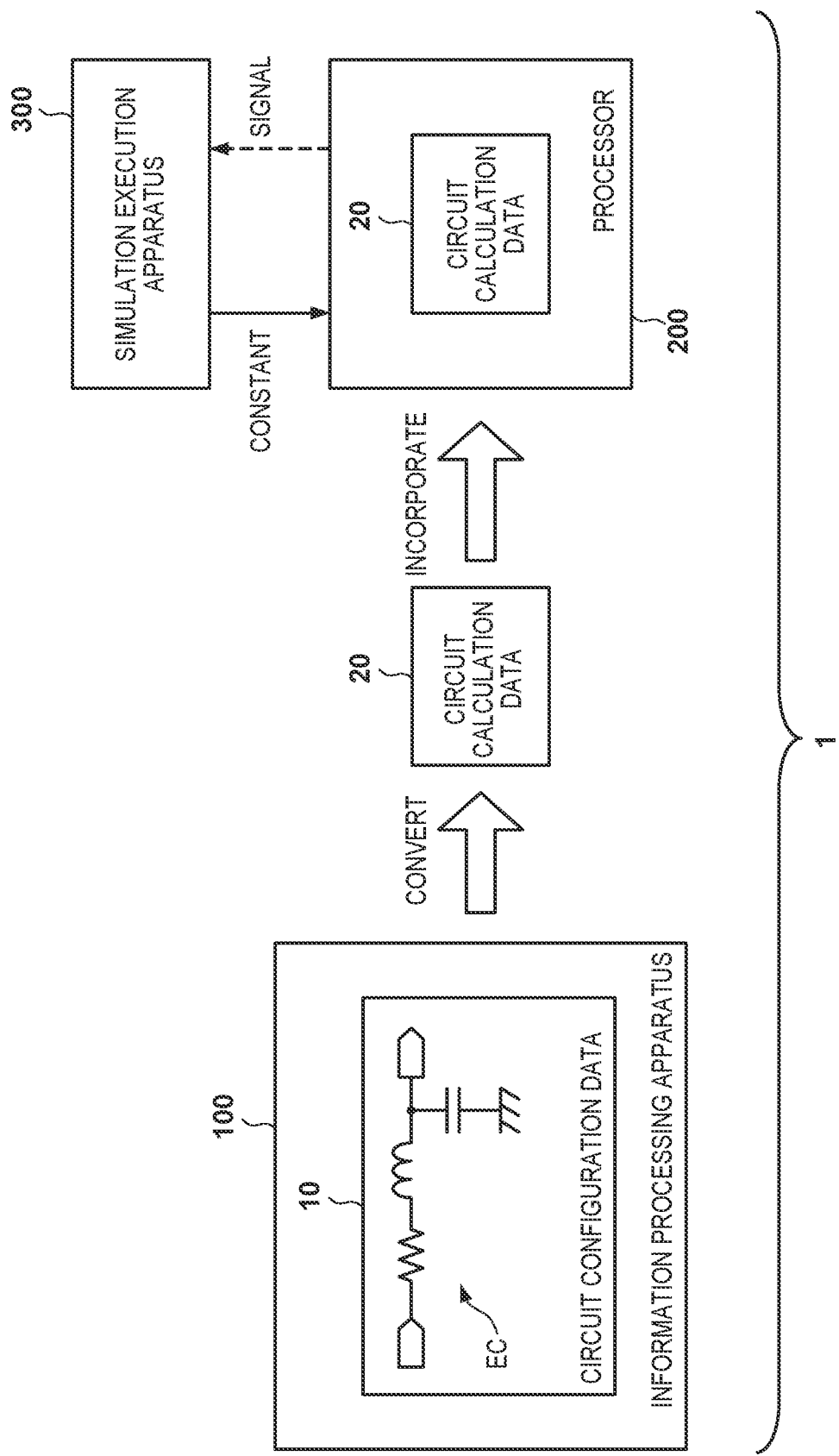
FIG. 1 is a view exemplarily showing a simulation system and a simulation method according to an embodiment of the present invention.

Hereinafter, embodiments will be described in detail with reference to the accompanying drawings. It should be noted that the following embodiments are not intended to limit the scope of the appended claims, and that not all the combinations of features described in the embodiments are necessarily essential to the present invention. Of a plurality of features described in the embodiments, two or more features may arbitrarily be combined. In addition, the same reference numerals denote the same or similar parts, and a repetitive description will be omitted.

Figure 2:
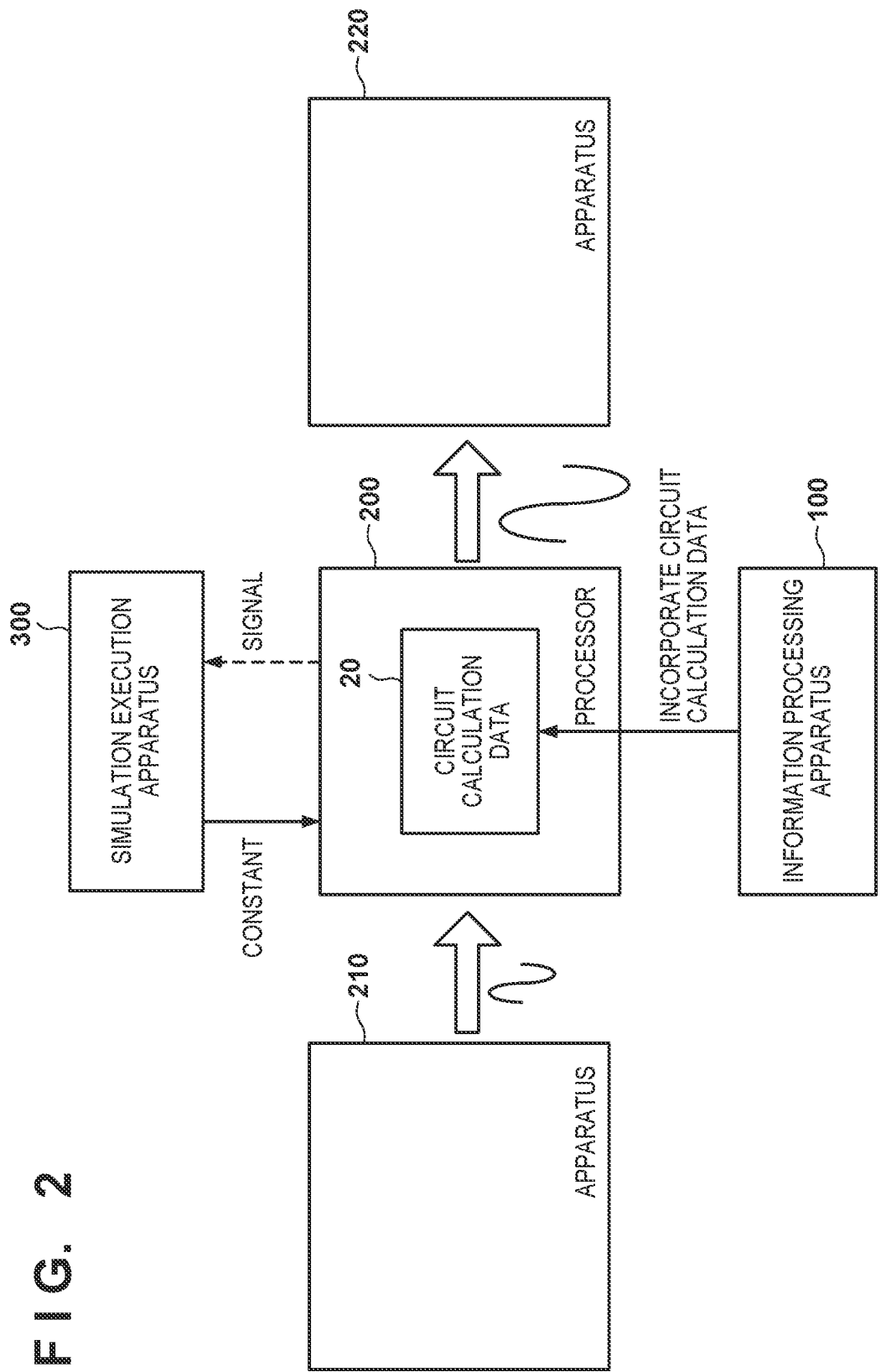
FIG. 2 is a view exemplarily showing a simulation system and a simulation method according to the embodiment of the present invention.

FIGS. 1 and 2 exemplarily show a simulation system 1 and a simulation method according to an embodiment of the present invention. The simulation system 1 can include, for example, an information processing apparatus 100, a processor 200, and a simulation execution apparatus 300. The simulation execution apparatus 300 may be incorporated in the information processing apparatus 100 as a module like a simulation execution unit. The information processing apparatus 100 may have a design function (CAD function) for designing an electric circuit EC. Such a design function can be provided by installing a CAD program in the information processing apparatus 100. The electric circuit EC includes an input terminal group and an output terminal group. An output signal group corresponding to an input signal group given to the input terminal group can be output from the output terminal group.

The information processing apparatus 100 can have a function of converting circuit configuration data 10 representing the configuration of the electric circuit EC into circuit calculation data 20 including an equation group that generates an output signal group corresponding to an argument group given to a variable group and an input signal group given to the input terminal group of the electric circuit EC. The argument group can include constants (numerical values) representing the characteristics of the circuit elements (for example, a resistor, a capacitor, an inductor, a transistor, an LSI, and the like) that form the electric circuit EC. The argument group can include a value concerning a temperature. In this case, the constants can include the temperature coefficients of the circuit elements. The argument group may include a value concerning noise applied to the electric circuit EC.

The circuit calculation data 20 can be incorporated in the processor 200 by the information processing apparatus 100 or another apparatus. In the processor 200 incorporating the circuit calculation data 20, a virtual electric circuit corresponding to the electric circuit EC is constructed. The processor 200 can be, for example, a processor including a real time OS. In this case, the circuit calculation data 20 generated by the information processing apparatus 100 is data in a format that can be incorporated in the processor 200 including the real time OS or data that can be converted into the format. The processor including the real time OS can generate, for example, an output signal corresponding to a given input signal in a very short time (for example, several microseconds to several hundred microseconds). The processor 200 may be, for example, a processor including an FPGA. In this case, the circuit calculation data 20 is data in a format that can be incorporated in the FPGA (that can program the FPGA) or data that can be converted into the format.

The simulation execution apparatus 300 can be an information processing apparatus that gives an argument group (numerical values) to the variable group of the processor 200 incorporating the circuit calculation data 20 (the variable group of the circuit calculation data 20 incorporated in the processor 200) and operates the processor 200. The simulation execution apparatus 300 can be formed by installing, in a computer including a processor, a memory, and the like, a program configured to cause the computer to operate as the simulation execution apparatus 300. The argument group that the simulation execution apparatus 300 gives to the processor 200 is the argument group given to the variable group of the circuit calculation data 20. The argument group can include constants (numerical values) representing the characteristics of the circuit elements (for example, a resistor, a capacitor, an inductor, a transistor, an LSI, and the like) that form the electric circuit EC. The argument group can include a value concerning a temperature. In this case, the constants can include the temperature coefficients of the circuit elements. The argument group can include a value concerning noise applied to the electric circuit EC.

In a verification work for verifying the operations of apparatuses 210 and 220 connected to the electric circuit EC, a verification work for verifying the operation of the electric circuit EC, or a verification work for verifying the operations of the electric circuit EC and the apparatuses 210 and 220 connected to that, the simulation execution apparatus 300 gives the argument group to the processor 200 incorporating the circuit calculation data 20 and operates the processor 200. At this time, a signal group can be supplied from the apparatus 210 to the processor 200, and a signal group can be supplied from the processor 200 to the apparatus 220. Alternatively, a signal group may be supplied from the apparatus 210 to the processor 200, and a signal group may be supplied from the processor 200 to the apparatus 210. A signal group may be supplied from the apparatus 220 to the processor 200, and a signal group may be supplied from the processor 200 to the apparatus 220. The simulation execution apparatus 300 may receive a signal group from the processor 200.

The circuit calculation data 20 may be transferred from the information processing apparatus 100 to the simulation execution apparatus 300, and incorporated in the processor 200 by the simulation execution apparatus 300. In addition, some or all of the above-described argument group (for example, the constants representing the characteristics of the circuit elements that form the electric circuit EC and the values concerning temperatures) may be transferred from the information processing apparatus 100 to the simulation execution apparatus 300, and upon receiving these, the simulation execution apparatus 300 may give the argument group to the processor 200.

Figure 3:
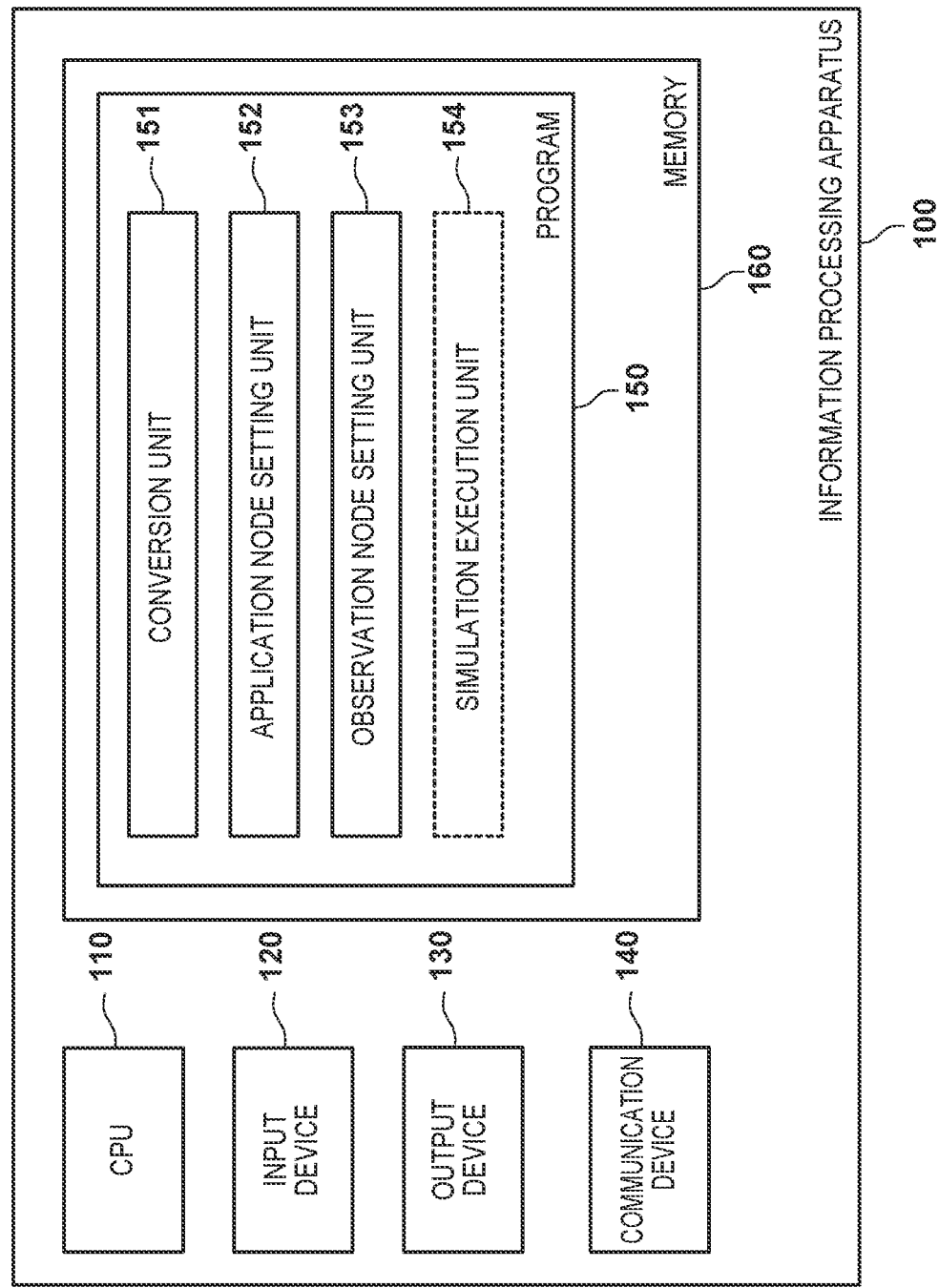
FIG. 3 is a view showing an example of the configuration of an information processing apparatus including a conversion unit.

FIG. 3 shows an example of the configuration of the information processing apparatus 100. The information processing apparatus 100 can be formed by installing a program 150 in a computer. The program 150 can be, for example, stored in a memory medium and provided to the computer in that form. Alternatively, the program 150 can be provided to the computer via a communication channel.

The information processing apparatus 100 can include, for example, a CPU (processor) 110, an input device 120, an output device 130, a communication device 140, and a memory 160. The input device 120 can include, for example, a keyboard, a pointing device, and the like. The output device 130 can include, for example, a display. The communication device 140 can include, for example, any device configured to communicate with another apparatus. The memory 160 can include one or a plurality of memory devices. The plurality of memory devices can include, for example, a volatile memory device and a nonvolatile memory device. The concept of the nonvolatile memory device can include an electrically writable and erasable semiconductor memory device, a disk memory, a semiconductor memory device backed up by a battery, and the like.

The program 150 can include, for example, a program module that causes the information processing apparatus 100 to operate as an apparatus including the conversion unit 151. The conversion unit 151 converts circuit configuration data representing the configuration of the electric circuit EC into the circuit calculation data 20 including an equation group that generates an output signal group corresponding to an argument group given to a variable group and an input signal group given to the input terminal group of the electric circuit EC. The program 150 may include a program module that causes the information processing apparatus 100 to operate as an apparatus including an application node setting unit 152 that sets a node (to be referred to as a noise application node hereinafter) in the electric circuit EC, to which noise is applied. The program 150 may include a program module that causes the information processing apparatus 100 to operate as an apparatus including an observation node setting unit 153 that sets an observation node in the electric circuit EC. The conversion unit 151 can generate the circuit calculation data 20 such that the output signal group includes an output signal representing the electrical value of the observation node. Also, as described above, the simulation execution apparatus 300 may be incorporated in the information processing apparatus 100. In this case, the program 150 can include a program module that causes the information processing apparatus 100 to operate as an apparatus that forms a simulation execution unit 154 corresponding to the simulation execution apparatus 300.

Figure 4:
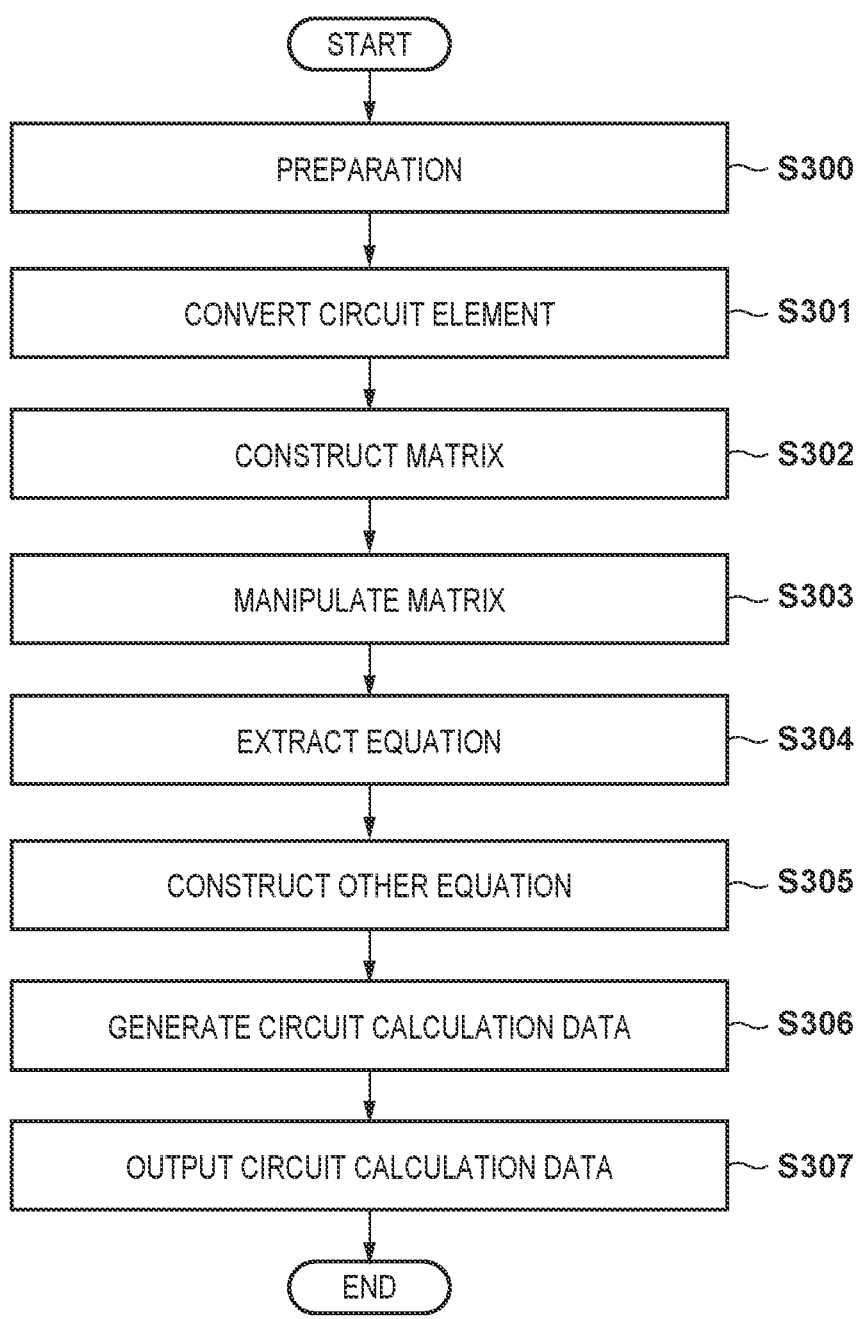
FIG. 4 is a flowchart showing an example of the operation of the information processing apparatus including the conversion unit.
Figure 5:
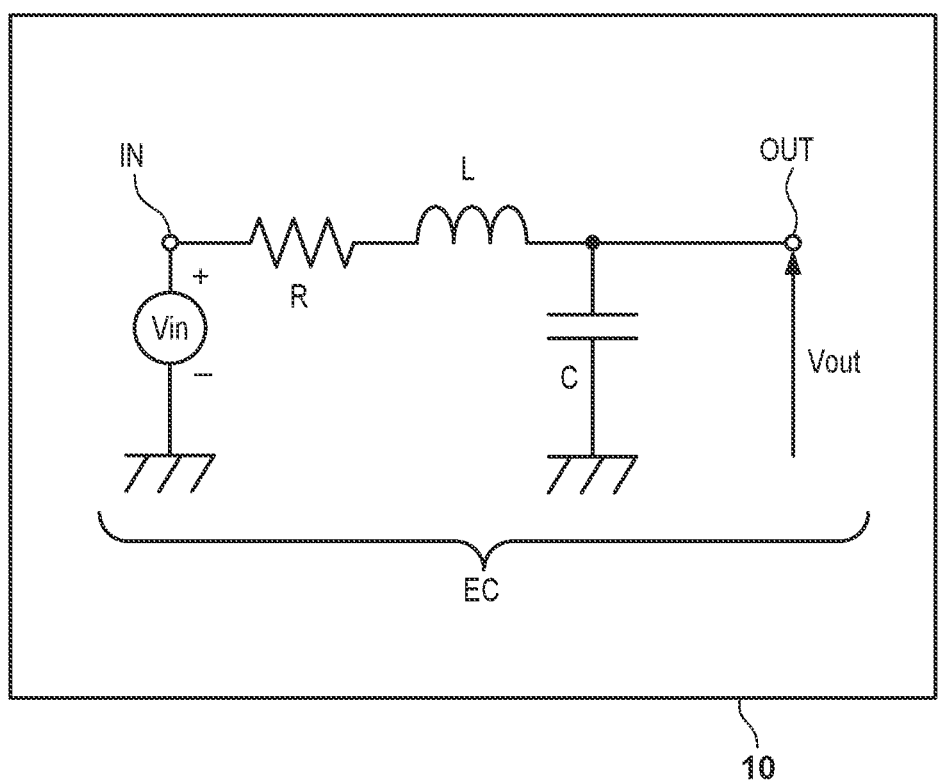
FIG. 5 is a view showing an example of the configuration of an electric circuit.
Figure 6A:
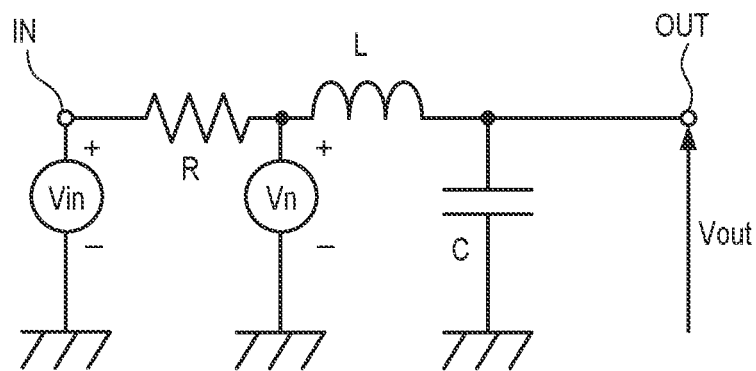
FIG. 6A is a view showing an example of setting of a noise application node.
Figure 6B:
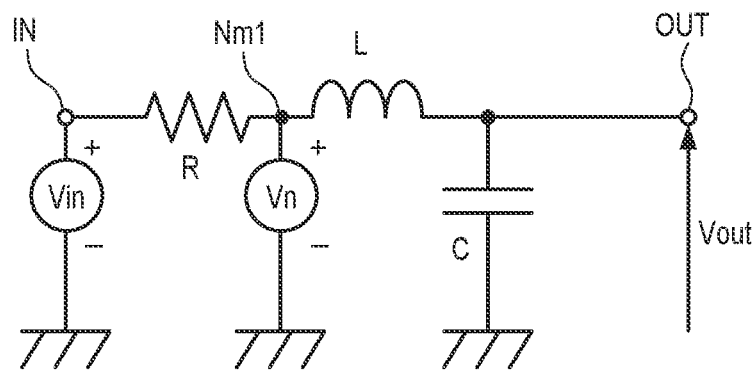
FIG. 6B is a view showing an example of setting of an observation node.

FIG. 4 shows an example of the operation of the information processing apparatus 100. An example in which the circuit configuration data 10 representing the configuration of the electric circuit EC shown in FIG. 5 is converted into the circuit calculation data 20 will be described here. Step S300 can arbitrarily be executed. In step S300, the application node setting unit 152 can set a noise application node in the electric circuit EC in accordance with the operation of the input device 120 by the user. FIG. 6A shows an example in which a node that connects a resistor R and an inductor L is set as a noise application node. In step S300, the observation node setting unit 153 may set an observation node in the electric circuit EC in accordance with the operation of the input device 120 by the user. FIG. 6B shows an example in which a node that connects the resistor R and the inductor L is set as an observation node Nm1. In the examples shown in FIGS. 6A and 6B, a voltage source Vn serving as a noise source is connected to the noise application node. A current source serving as a noise source may be added to the noise application node. The addition of the current source serving as a noise source can be done such that a current supplied by the current source flows to the noise application node.

Figure 7A:
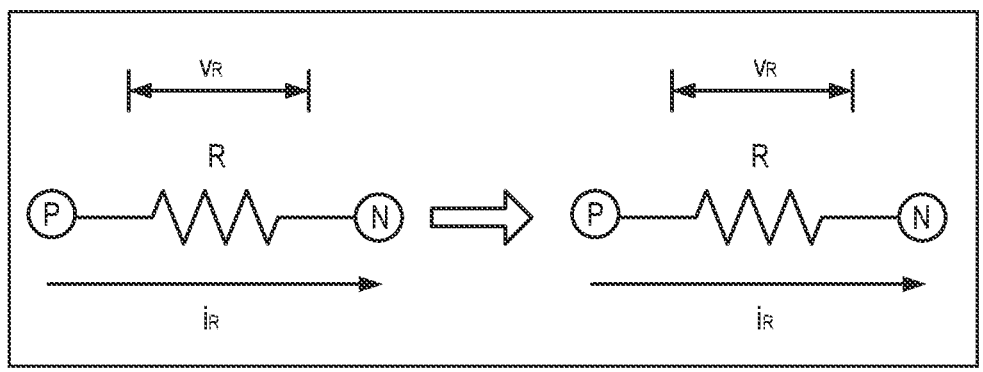
Figure 7B:
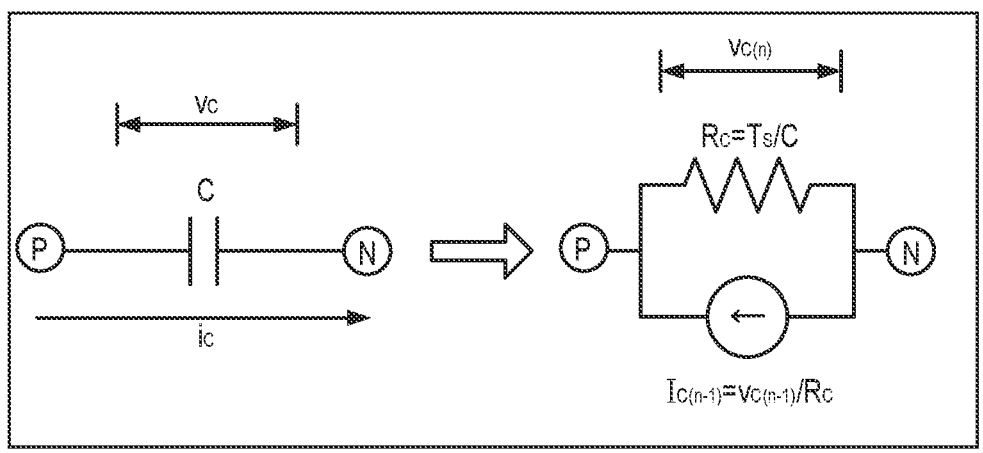
Figure 7C:
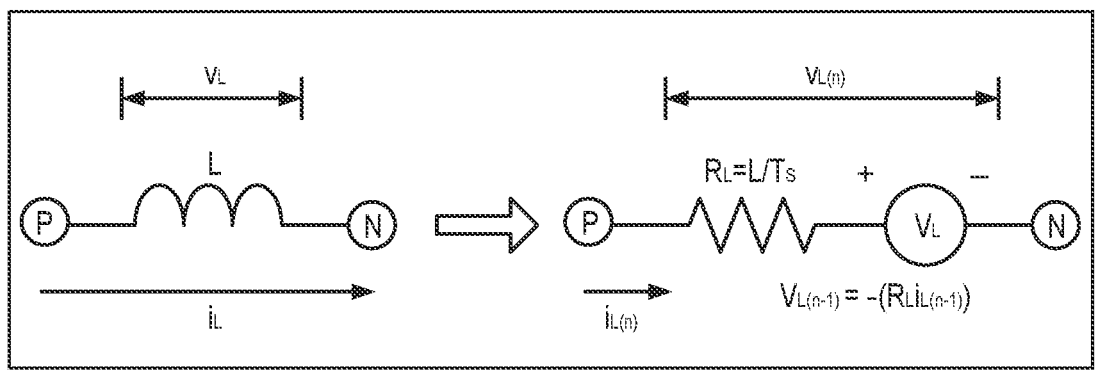

In step S301, the conversion unit 151 can convert the circuit elements that form the electric circuit EC into circuit element models (equivalent circuit models) in accordance with a preset conversion rule. Here, FIGS. 7A, 7B, and 7C show conversion rules for converting the resistor R, a capacitor C, and the inductor L into circuit element models, respectively. By this conversion, for example, the electric circuit EC shown in FIG. 5 can be converted into an electric circuit EC' shown in FIG. 8. The electric circuit EC' is an equivalent circuit of the electric circuit EC.

Figures 8, 9:
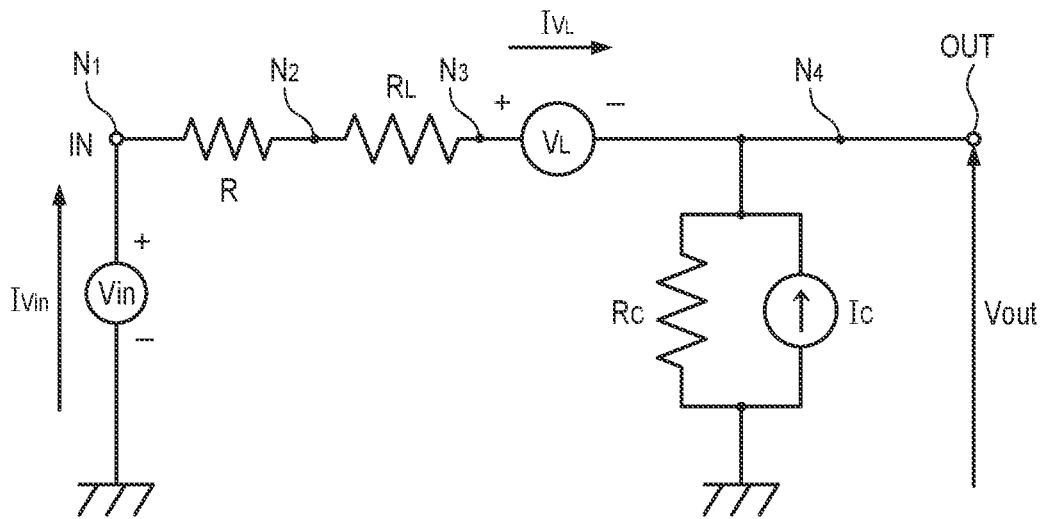
FIG. 8 is a view showing a converted electric circuit.
FIG. 9 is a view showing a model of an equation of a matrix representation that can be constructed in the embodiment of the present invention.
Figure 10:
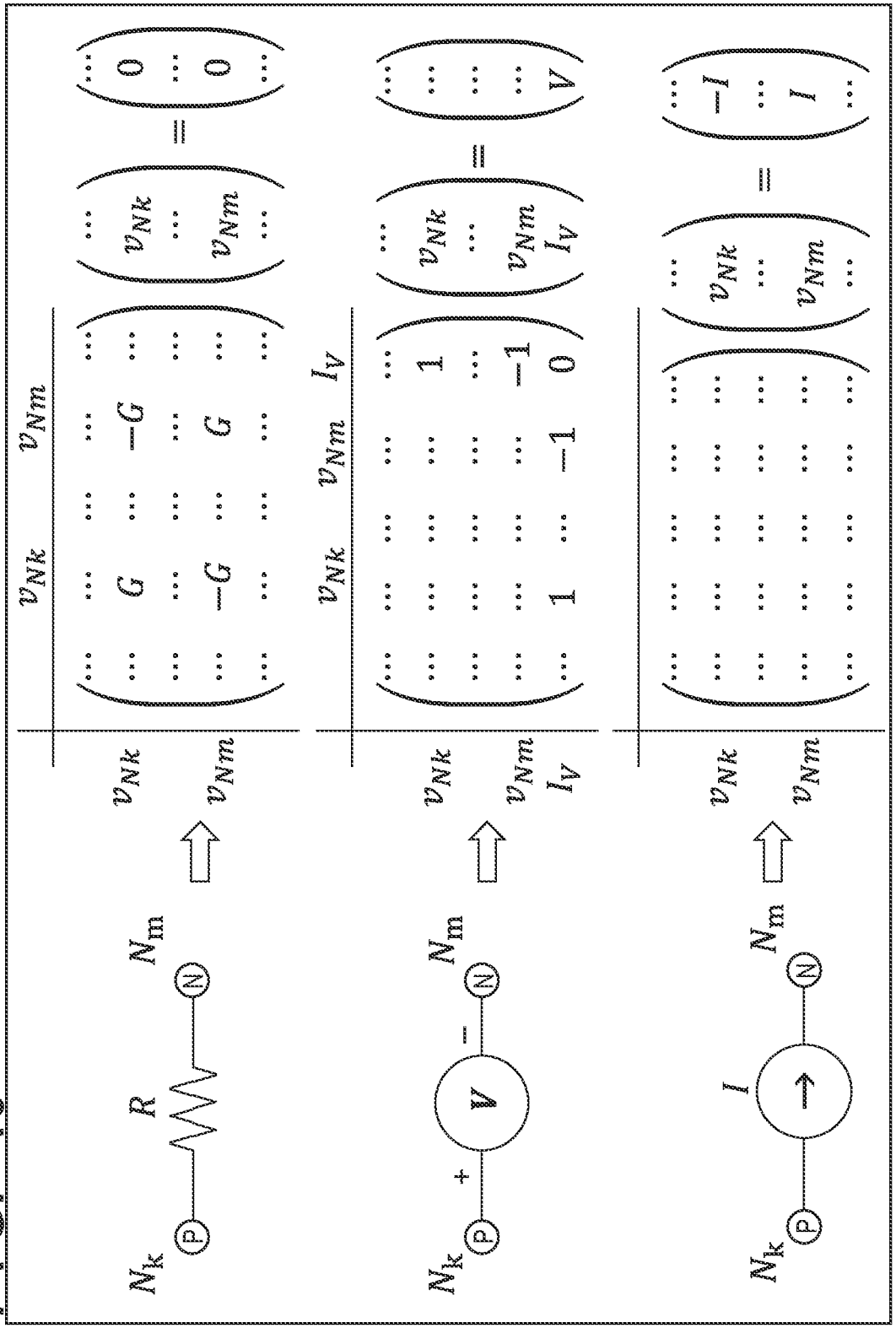
FIG. 10 is a view showing a stamp rule.

In step S302, the conversion unit 151 can construct an equation of a matrix representation from the circuit configuration data 10 representing the configuration of the electric circuit EC in accordance with, for example, modified nodal analysis (MNA) or the like. FIG. 9 shows a model of an equation of a matrix representation that can be constructed in step S302. A matrix including $G_{11}$ to $G_{nn}$ as elements is a conductance matrix. Note that the value of a conductance is the reciprocal of the value of a resistor. A conductance matrix G corresponds to the resistor R (the reciprocal of the value of R), and a conductance matrix GL corresponds to a resistor $R_L$ (the reciprocal of the value of $R_L$). $x_1$ to $x_n$ are variable vectors, and can be the voltage values of nodes $N_1$ to $N_n$ (for example, $N_1$, $N_2$, $N_3$, and $N_4$) or the current values (for example, $I_{vin}$ and $I_{VL}$) of voltage sources (for example, $V_{in}$ and $V_L$). $A_1$ to $A_n$ are input vectors, and can be a voltage source (for example, $V_{in}$ or $V_L$) or a current source (for example, $I_C$). Here, the nodes $N_1$ to $N_n$ can be decided as shown in FIG. 10, and the elements of the conductance matrix and the elements of the input vectors can be decided for each circuit element in accordance with a stamp rule shown in FIG. 10. The constant of each circuit element is handled not as a specific numerical value but as a variable, and the elements of the conductance matrix are the variables. In this way, the equation of the matrix representation shown in FIG. 11 can be constructed.

In step S303, the conversion unit 151 can manipulate the equation of the matrix representation constructed in step S302 as shown in FIG. 12. For this manipulation, for example, Gaussian elimination can be applied. That is, when a matrix that connects a conductance matrix and input vectors is created, and manipulation is performed such that the conductance matrix changes to a unit matrix, thereby obtaining an equation used to calculate the value of an electrical signal to be obtained. FIG. 13 shows the result of the matrix manipulation.

In step S304, the conversion unit 151 extracts, from the equation obtained in step S303, equations to be incorporated in the processor 200. The extraction target equations can include an equation for giving the value of an electrical signal that appears in the observation node set by the observation node setting unit 153 in step S300, in addition to an equation for giving the value of an electrical signal that appears in the output terminal of the electric circuit EC. FIG. 14 shows equations that can be extracted in step S304.

If a noise application node is set by the application node setting unit 152 in step S300, an equation for calculating the value of the electrical signal of the noise application node can also be extracted in step S306. Accordingly, an input terminal configured to apply noise to the noise application node is added to the circuit calculation data 20 to be generated. This allows the simulation execution apparatus 300 to, in a verification operation, apply noise to the noise application node in the virtual electric circuit constructed in the processor 200.

In step S304, to enable a simulation of the electric circuit EC depending on a temperature, an equation for giving a value depending on the temperature to a variable for setting the constant of a circuit element may be constructed. For example, $R=R'(1+dT \times kr1)$ can be constructed concerning the variable R representing the resistance value of the resistor R, $C=C'(1+dT \times kc1)$ can be constructed concerning the variable C representing the capacitance value of the capacitor C, and $L=L'(1+dT \times kl1)$ can be constructed concerning the variable L representing the inductance value of the inductor L. Here, R' is a variable representing the resistance value of the resistor R at a reference temperature T, dT is a variable representing the difference (T−T') between the reference temperature T and a temperature T' to execute the simulation, and kr1, kc1, and Kl1 are variables representing temperature coefficients. R', C', L', kr1, kc1, and Kl1 allow the simulation execution apparatus 300 to give information concerning the temperature to the processor 200 in a verification work. In step S304, an equation for obtaining a current $I_c$ flowing to the capacitor C from a potential difference Vc across the resistor Rc converted from the capacitor C, for example, $I_c=G_C V_c$ or the like may be constructed.

In step S306, the conversion unit 151 generates the circuit calculation data 20 including an equation group including the equations extracted in step S304 and the equations constructed in step S305. The equation group of the circuit calculation data 20 is a function group including, as variable groups, a first variable group to which the constants of the circuit elements or the like are given as an argument group, and a second variable group to which an input signal group to be given to the input signal group is given as an argument group. That is, the equation group of the circuit calculation data 20 provides, as return values, function values according to the argument group given to the variable group. In step S307, the circuit calculation data 20 generated by the conversion unit 151 in step S306 can be output from the information processing apparatus 100 to, for example, the processor 200, the simulation execution apparatus 300, or another apparatus. For example, the information processing apparatus 100 can operate such that the circuit calculation data 20 is incorporated in the processor 200. Alternatively, the simulation execution apparatus 300 or another apparatus, which has received the circuit calculation data 20 from the information processing apparatus 100, can operate such that the circuit calculation data 20 is incorporated in the processor 200.

The equation group of the circuit calculation data 20 generates an output signal group corresponding to the argument group given to the variable group and the input signal group given to the input terminal group. The argument group can include the constants (for example, R', C', and L') representing the characteristics of the circuit elements that form the electric circuit EC, values (for example, T and T') concerning temperatures, and the temperature coefficients (for example, kr1, kc1, and Kl1) of the circuit elements. The values of the argument group are supplied to the processor 200 by the simulation execution apparatus 300 in a verification work. Hence, for example, when executing a verification work while changing the values of the constants (for example, R', C', and L') representing the characteristics of the circuit elements that form the electric circuit EC, it is unnecessary to generate the circuit calculation data 20 for each value and incorporate it in the processor 200. Changing the argument group (numerical values) to be given to the processor 200 by the simulation execution apparatus 300 suffices.

FIG. 15 shows the execution procedure of a simulation method in the simulation system 1. Steps S1601, S1602, and S1603 are executed by the information processing apparatus 100, and steps S1601 and S1602 correspond to step S300 in FIG. 4. Step S1603 (conversion step) corresponds to steps S301 to S306 in FIG. 4. Step S1604 (incorporation step) corresponds to step S307 in FIG. 4.

Steps S1605, S1606, and S1607 can be controlled by the simulation execution apparatus 300. In step S1605, the simulation execution apparatus 300 gives the argument group to the variable group of the circuit calculation data 20 incorporated in the processor 200. In step S1606, the simulation execution apparatus 300 operates the processor 200 and executes a simulation. At this time, a signal group can be supplied from the apparatus 210 to the processor 200 (virtual terminals constructed in correspondence with the input terminals of the electric circuit EC), and a signal group can be supplied from the processor 200 (virtual terminals constructed in correspondence with the output terminals of the electric circuit EC) to the apparatus 220. Alternatively, a signal group may be supplied from the apparatus 210 to the processor 200, and a signal group may be supplied from the processor 200 to the apparatus 210. A signal group may be supplied from the apparatus 220 to the processor 200, and a signal group may be supplied from the processor 200 to the apparatus 220. The simulation execution apparatus 300 may receive a signal group from the processor 200.

In step S1605, the simulation execution apparatus 300 can give arbitrary noise to the noise application node in the virtual electric circuit corresponding to the electric circuit EC and constructed by the processor 200. Also, in step S1605, the electrical signal of the observation node can be observed.

In step S1607, the simulation execution apparatus 300 determines whether to change at least one of the argument groups and re-execute the simulation. To re-execute the simulation, the process returns to step S1605 to reset the argument group to be given to the variable group of the circuit calculation data 20 incorporated in the processor 200 and re-execute step S1606. In the repeat of processing including steps S1605 and S1606, the circuit calculation data 20 need not newly be incorporated in the processor 200.

Explaining in another viewpoint, the simulation execution apparatus 300 can execute a second operation after a first operation to be described below is executed. In the first operation, the simulation execution apparatus 300 gives a first argument group to the variable group of the circuit calculation data 20 incorporated in the processor 200, and causes the processor 200 to generate a first output signal group corresponding to the first argument group and the input signal group from the apparatus 210. In the second operation, the simulation execution apparatus 300 gives a second argument group different from the first argument group to the variable group of the circuit calculation data 20 incorporated in the processor 200, and causes the processor 200 to generate a second output signal group corresponding to the second argument group and the input signal group from the apparatus 210. Here, between the first operation and the second operation, the circuit calculation data 20 is not newly incorporated in the processor 200.

As described above, according to this embodiment, it is possible to incorporate, in the processor 200, the circuit calculation data 20 that can set an argument group including constants representing the characteristics of circuit elements, and the like from the outside (simulation execution apparatus 300) and execute a simulation while freely changing the argument group. Hence, according to this embodiment, it is possible to largely shorten the time needed for a verification work.

The invention is not limited to the above-described embodiment, and various modifications and changes can be made within the scope of the gist of the invention.

REFERENCE SIGNS LIST

EC . . . electric circuit, 10 . . . circuit configuration data, 20 . . . circuit calculation data

What is claimed is:

1. An information processing apparatus comprising
a conversion unit configured to convert circuit configuration data representing a configuration of an electric circuit including an input terminal group and an output terminal group into circuit calculation data including an equation group that generates an output signal group corresponding to an argument group given to a variable group and an input signal group given to the input terminal group; and
an application node setting unit configured to set a node in the electric circuit, which is designated by a user, as a noise application node to which a noise is applied,
wherein in a case where the noise application node is set by the application node setting unit, the conversion unit adds, to the circuit calculation data, a noise input terminal for giving the noise to the noise application node,
wherein the argument group includes a constant representing a characteristic of a circuit element that forms the electric circuit, and a value concerning the noise applied to the noise application node via the noise input terminal.

2. The information processing apparatus according to claim 1, wherein the argument group includes a value concerning a temperature, and the constant includes a temperature coefficient of the circuit element.

3. The information processing apparatus according to claim 1, further comprising an observation node setting unit configured to set an observation node in the electric circuit, wherein the conversion unit generates the circuit calculation data such that the output signal group includes an output signal representing an electrical value of the observation node.

4. The information processing apparatus according to claim 1, further comprising a simulation execution unit configured to give the argument group to a processor incorporating the circuit calculation data and operate the processor.

5. The information processing apparatus according to claim 4, wherein
the simulation execution unit
executes a first operation of giving a first argument group to the processor and causing the processor to generate a first output signal group corresponding to the first argument group and the input signal group,
executes, after the first operation, a second operation of giving a second argument group different from the first argument group to the processor and causing the processor to generate a second output signal group corresponding to the second argument group and the input signal group, and
the circuit calculation data is not newly incorporated in the processor between the first operation and the second operation.

6. The information processing apparatus according to claim 5, wherein the first argument group includes a first value concerning the constant representing the characteristic of the circuit element, and the second argument group includes a second value concerning the constant representing the characteristic of the circuit element.

7. The information processing apparatus according to claim 5, wherein the first argument group includes a first value concerning the temperature, and the second argument group includes a second value concerning the temperature.

8. The information processing apparatus according to claim 5, wherein the first argument group includes a first value concerning the noise, and the second argument group includes a second value concerning the noise.

9. The information processing apparatus according to claim 4, wherein the processor is a processor including a real time OS or an FPGA.

10. The information processing apparatus according to claim 4, wherein a signal is supplied from an apparatus connected to be input terminal group to a terminal group of the processor corresponding to the input terminal group.

11. An information processing apparatus comprising
a simulation execution unit configured to give an argument group to a processor incorporating circuit calculation data that is converted from circuit configuration data representing a configuration of an electric circuit including an input terminal group and an output terminal group and includes an equation group that generates an output signal group corresponding to the argument group given to a variable group and an input signal group given to the input terminal group, and operate the processor,
wherein the argument group includes a constant representing a characteristic of a circuit element that forms the electric circuit, and a value concerning a noise applied to a noise application node designated by a user,
wherein the circuit calculation data includes a noise input terminal for giving the noise to the noise application node, and
wherein the value concerning the noise is applied to noise application node via the noise input terminal.

12. The information processing apparatus according to claim 11, wherein the argument group includes a value concerning a temperature, and the constant includes a temperature coefficient of the circuit element.

13. The information processing apparatus according to claim 12, wherein the output signal group includes an output signal representing an electrical value of an observation node in the electric circuit.

14. The information processing apparatus according to claim 11, wherein the simulation execution unit executes a first operation of giving a first argument group to the processor and causing the processor to generate a first output signal group corresponding to the first argument group and the input signal group, executes, after the first operation, a second operation of giving a second argument group different from the first argument group to the processor and causing the processor to generate a second output signal group corresponding to the second argument group and the input signal group, and the circuit calculation data is not newly incorporated in the processor between the first operation and the second operation.

15. The information processing apparatus according to claim 14, wherein the first argument group includes a first value concerning the temperature, and the second argument group includes a second value concerning the temperature.

16. The information processing apparatus according to claim 15, wherein the first argument group includes a first value concerning the constant representing the characteristic of the circuit element, and the second argument group includes a second value concerning the constant representing the characteristic of the circuit element.

17. The information processing apparatus according to claim 15, wherein the first argument group includes a first value concerning the noise, and the second argument group includes a second value concerning the noise.

18. The information processing apparatus according to claim 11, wherein the processor is a processor including a real time OS or an FPGA.

19. The information processing apparatus according to claim 11, wherein a signal is supplied from an apparatus connected to be input terminal group to a terminal group of the processor corresponding to the input terminal group.

20. A non-transitory computer readable medium storing a program causing a computer to operate as an information processing apparatus defined in claim 1.

21. A non-transitory computer readable medium storing a program causing a computer to operate as an information processing apparatus defined in claim 11.

22. A simulation method comprising:

an application node setting step of setting a node in an electric circuit, which is designated by a user, as a noise application node to which a noise is applied, the electric circuit including an input terminal group and an output terminal group a conversion step of converting circuit configuration data representing a configuration of the electric circuit into circuit calculation data including an equation group that generates an output signal group corresponding to an argument group given to a variable group and an input signal group given to the input terminal group;

an incorporating step of incorporating the circuit calculation data in a processor; and a simulation execution step of giving the argument group to a processor incorporating the circuit calculation data and operate the processor, wherein the conversion step includes adding, to the noise application node, a noise input terminal for giving the noise to the noise application node, in a case where the noise application node is set in the application node setting step, and wherein the argument group includes a constant representing a characteristic of a circuit element that forms the electric circuit, and a value concerning the noise applied to the noise application node via the noise input terminal.

* * * * *